(12) United States Patent
Chemin et al.

(10) Patent No.: US 9,296,132 B2
(45) Date of Patent: Mar. 29, 2016

(54) METHOD FOR TEXTURING A SUBSTRATE HAVING A LARGE SURFACE AREA

(71) Applicant: SAINT-GOBAIN GLASS FRANCE, Courbevoie (FR)

(72) Inventors: Nicolas Chemin, Bagneux (FR); Jeremie Teisseire, Antony (FR); Elin Sondergard, Cachan (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/401,363

(22) PCT Filed: May 14, 2013

(86) PCT No.: PCT/FR2013/051048
§ 371 (c)(1),
(2) Date: Nov. 14, 2014

(87) PCT Pub. No.: WO2013/171420
PCT Pub. Date: Nov. 21, 2013

(65) Prior Publication Data
US 2015/0140837 A1    May 21, 2015

(30) Foreign Application Priority Data

May 14, 2012 (FR) .................................. 12 54373

(51) Int. Cl.
*H01L 21/02* (2006.01)
*B29C 43/12* (2006.01)
(Continued)

(52) U.S. Cl.
CPC ............. *B29C 43/12* (2013.01); *B29C 35/0227* (2013.01); *B29C 59/026* (2013.01);
(Continued)

(58) Field of Classification Search
CPC ................... H01L 21/02359; H01L 21/02118; B82Y 40/00; B82Y 10/00; B29C 35/0227; B29C 59/026; B29C 43/12; B29C 2043/3644; B29C 2059/023; G03F 7/0002
USPC ........................................................ 438/781
See application file for complete search history.

(56) References Cited

U.S. PATENT DOCUMENTS 4,360,266 A   11/1982   Takeuchi
5,393,365 A   2/1995   Smith
(Continued)

FOREIGN PATENT DOCUMENTS

GB   1 493 348    11/1977
GB   2 057 152    3/1981
WO   2005/051636   6/2005

OTHER PUBLICATIONS

International Search Report issued Jul. 26, 2013, in PCT/FR13/051048, filed May 14, 2013.
(Continued)

*Primary Examiner* — Caleen Sullivan
(74) *Attorney, Agent, or Firm* — Oblon, McClelland, Maier & Neustadt, L.L.P.

(57) ABSTRACT

The invention relates:
to a process for forming a texture on a substrate, comprising:
depositing a deformable layer on the substrate;
bringing this deformable layer into contact with the textured face of a daughter stamp;
introducing the coated substrate and the daughter stamp into a pouch made of an impermeable material;
introducing the pouch and its contents into a hermetic vessel;
evacuating air from the vessel until a pressure at most equal to 0.5 bar is reached;
sealing the pouch before reintroducing air into the vessel;
introducing the sealed pouch and its contents into an autoclave;
applying a pressure comprised between 0.5 and 8 bar and a temperature comprised between 25 and 400° C. for 15 minutes to a plurality of hours;
opening the pouch; then
separating the substrate and the daughter stamp;
to a transparent assembly, comprising a glass substrate coated with a textured layer, obtained by this process; and
to applications of this process to obtain a substrate intended to extract, guide or redirect light, or
a superhydrophobic or superhydrophilic substrate.

15 Claims, 1 Drawing Sheet

Figure 1:
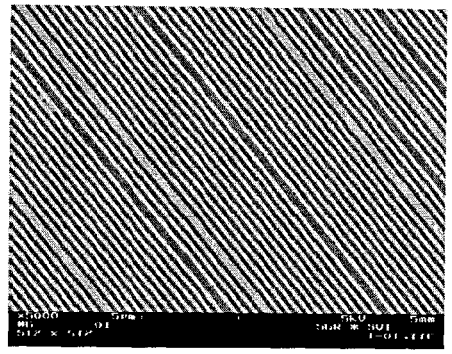

(51) Int. Cl.
*G03F 7/00* (2006.01)
*B29C 35/02* (2006.01)
*B29C 59/02* (2006.01)
*B82Y 10/00* (2011.01)
*B82Y 40/00* (2011.01)
*B29C 43/36* (2006.01)

(52) U.S. Cl.
CPC ............... *B82Y 10/00* (2013.01); *B82Y 40/00* (2013.01); *G03F 7/0002* (2013.01); *B29C 2043/3644* (2013.01); *B29C 2059/023* (2013.01)

(56) References Cited

U.S. PATENT DOCUMENTS

| | | |
|---|---|---|
| 5,501,910 A | 3/1996 | Smith |
| 2003/0159608 A1 | 8/2003 | Heidari |
| 2005/0253309 A1 | 11/2005 | Hou et al. |
| 2007/0098958 A1 | 5/2007 | Katsoulis et al. |

OTHER PUBLICATIONS

Pfeiffer, K. et al., "A Comparison of thermally and photochemically cross-linked polymers for nanoimprinting", Microelectronic Engineering, vol. 67-68, pp. 266-273, 2003, XP004428879.

METHOD FOR TEXTURING A SUBSTRATE HAVING A LARGE SURFACE AREA

The invention relates to a process for texturing a substrate having a large area (of about one m² at least), based on the transfer of a micro- (5 to 100 µm), meso- (1 to 5 µm) and/or nano-scale (10 to 1000 nm) pattern from a stamp (or mask) to a layer deposited on the surface of the substrate (nanoimprint lithography or NIL).

Using a pressurized fluid to compress the stamp against the substrate allows limitations usually observed when texturing large substrates, when a mechanical press is used, to be overcome. These limitations essentially originate from planarity defects in the stamp and substrate that cannot be corrected. When the stamp and the substrate are placed between the rigid plates of the mechanical press, planarity defects lead to a variation in the pressure exerted by the stamp on the substrate and therefore to a variation in the depth of the transferred patterns. Zones may exist in which the stamp and substrate do not make contact, therefore in which there is no pattern transfer. The occurrence of this phenomenon increases with the area to be textured. Insofar as the pressure exerted by a fluid is isostatic, the problem of force equilibrium observed with mechanical presses is no longer encountered. This makes it a preferred technique in the field of NIL imprinting at the present time. The pressure is applied uniformly over the entire area of the stamp thereby allowing the layer to be deformed uniformly.

Various methods may be used to transmit the pressure of the fluid to the stamp and/or substrate. It may be a question of a pressure vessel or of a flexible membrane retranscribing the pressure of the fluid or of currents of pressurized fluids via apertures arranged along the contact surface.

However, this technique was initially and remains mainly developed for the microelectronics industry, it has not been adapted to glazing products:
  the processes used generally require specific apparatuses dedicated to this use;
  the size of large area substrates remains small relative to the scales of glazing products (several meters squared); and
  bringing the coated substrate into contact with the stamp is critical and requires specific technologies.

The inventors set themselves the goal of developing a process compatible with the glass industry and allowing a texture having a perfectly regular depth and made up of patterns of a few tens to a few hundred nanometers in size, for example, to be produced on a large area substrate.

This goal was achieved by the invention that, therefore, relates to a process for forming a texture on a substrate, characterized in that it comprises:
  depositing a deformable layer on the substrate;
  bringing this deformable layer into contact with the textured face of a daughter stamp;
  introducing the coated substrate and the daughter stamp into a pouch made of an impermeable material;
  introducing the pouch and its contents into a hermetic vessel;
  evacuating air from the vessel until a pressure at most equal to 0.5 bar is reached, the pressure possibly being decreased to values at most equal to 5 mbar;
  sealing the pouch before reintroducing air into the vessel;
  introducing the sealed pouch and its contents into an autoclave;
  applying a pressure comprised between 0.5 and 8 bar and a temperature comprised between 25 and 400° C. for 15 minutes to a plurality of hours;
  opening the pouch; then
  separating the substrate and the daughter stamp.

The texture formed according to the invention has dimensions comprised between 10 nm and 100 µm (depth of the valleys, height of the peaks, width/diameter of the peaks, width of the valleys, etc.) and even as high as values of several centimeters: "wall" of 10 µm×10 µm×4 cm.

It is possible, with this process, to form the texture on areas of about one square meter at least, even on areas as large in size as the glass sheets referred to as full float width (FFW) sheets (also known as PLF sheets from the French expression pleine largeur float meaning "full float width") which are in particular 3 m×6 m in size.

The deposition process used to deposit the deformable layer on the substrate is not limited. A wet deposition process is used (laminar flow coating, spray coating, dip coating, spin coating). In laminar flow coating, the liquid precursors of the deformable layer form, at rest, a meniscus suspended in a slot from which they are extracted by moving this slot in a crosswise position over the substrate.

The daughter stamp is so named because it results from the molding of its material in a master mold. Its textured material may be a polymer.

The material of the pouch is air impermeable.

The air of the vessel is evacuated until a pressure at most equal to 0.5 bar or, in order of increasing preference, to 5 mbar, 2 mbar or 1 mbar, is reached. For example, the air of the chamber is evacuated for fifteen minutes until a pressure of about 0.5 mbar is reached. The pouch is hermetically sealed before air is reintroduced into the vessel.

The sealed pouch is then placed in an autoclave that will allow a pressure comprised between 0.5 and 8 bar and a temperature comprised between 25 and 400° C. to be applied. The autoclave treatment may last between 15 minutes and several hours. These parameters must be adjusted depending on the nature of the deformable layer. Here, the objective is to press the daughter stamp against the initially deformable layer, a sol-gel layer inter alia, while cross-linking it in order to make it undeformable. In this way, the pattern inscribed into the surface of the daughter stamp is printed and set into the layer deposited on the surface of the substrate. The sealing step and the step of evacuating air are required if pressure is to be transmitted from the fluid to the stamp.

Once it has been removed from the autoclave, the pouch is pierced before being opened and the daughter stamp is withdrawn from the surface of the substrate. The layer may then be subjected to a new heat treatment in order to densify it, crystallize it ($TiO_2$, $ZnO$) and improve its mechanical properties and/or tailor the hydrophilic/hydrophobic nature of its surface.

The process of the invention does not require any specific apparatus (a system for placing in a pouch and an autoclave). It is compatible with devices commonly used in the glass industry, especially to laminate windshields or even to manufacture technical glazing units such as laminated units incorporating a liquid-crystal film, of the type sold by Saint-Gobain Glass under the registered trademark Privalite®.

Insofar as the process employs only already developed tools available on industrial manufacturing lines, this process would appear to be easily industrializable and compatible with the processing of large size glazing units.

The process is compatible with the use of low-cost stamps such as textured polymer sheets (especially produced roll-toroll). Insofar as the stamp is not destroyed during the process, it may be reused a number of times.

According to preferred features of the process of the invention:

- the deformable layer is made of a thermally cross-linkable material, especially a sol-gel material; having the advantage of leading to layers having a high inorganic content, able to withstand a tempering process of a glass sheet (forming the substrate); mention may be made of silica, titanium oxide, zinc and aluminum, alone or in a mixture of a number thereof; a silica sol is advantageously obtained by hydrolysis of a sol-gel precursor, preferably methylethoxysilane; it is important to control the conditions under which the sol-gel solution is produced so that the layer remains deformable during the process;
- the deformable layer comprises a thermoplastic polymer matrix; mention may be made of polymethyl methacrylate (PMMA), polystyrene (PS), polycarbonate (PC), polyvinyl chloride (PVC), polyamide (PA), polyethylene (PE) and polypropylene (PP), alone or in a blend or as a copolymer of a number thereof;
- the precursors of the deformable layer comprise nanoparticles such as (especially photocatalytic) $TiO_2$ nanoparticles or luminescent nanoparticles, for example of CdSe or CdS nanoparticles, and/or organic and/or pore-forming molecules such as latex, PMMA, PS and surfactants, certain of which are optionally intended to be eliminated before production of the final layer; mention may be made of the incorporation of an inorganic component (nanoparticles) into a thermoplastic polymer matrix, in order to improve the thermal resistance and mechanical strength (shock resistance for example) thereof, or to adjust the optical properties of the textured layer or even to provide it with a function;
- the textured face of the daughter stamp is air permeable; thus, when the stamp and layer are brought into contact in the sealing step, no particular precautions need to be taken to prevent air bubbles from being trapped between the coated substrate and the stamp; it may be formed from an elastomer (such as PDMS, EVA or an epoxy), a vitreous polymer or a copolymer; and
- the textured face of the daughter stamp is made of a polymer or hybrid organic (polymer)/inorganic material, and the temperature in the autoclave is raised in succession to a temperature above, then below the glass transition temperature of this polymer material, or vice versa; this feature makes it possible to control the mechanical behavior of the stamp with precision and to optimize the contact between the stamp and the coated substrate and the quality of the replication of the structures.

The invention also relates to:

- a transparent assembly comprising a glass substrate coated with a textured layer, obtained by a process such as described above; the glass is in particular a mineral glass such as soda-lime-silica float glass;
- an application of a process such as described above to obtain a substrate intended to extract, guide or redirect light; the fields of photovoltaics, daylighting (redirection of solar light toward the ceiling of a room via suitable texturing of a glazing unit), light extraction from OLEDs and polarizers are for example concerned;
- an application of a process such as described above to obtain a substrate intended for microfluidics; and
- an application of a process such as described above to obtain a superhydrophobic or superhydrophilic substrate; a superhydrophobic substrate may especially be produced by covering the textured layer with a sol-gel overlayer, for example one formed from a hydrophobic agent such as a fluorosilane, especially from known perfluoroalkylalkyl-trialkoxysilane precursors; the overlayer is advantageously very thin, having a thickness no larger than a few nanometers—it is then sometimes designated "monomolecular"—and thus practically does not modify the geometry of the underlying texture.

The invention is illustrated by the following examples:

FIG. 1 shows a scanning electron microscope image showing the texture of the PET daughter stamp employed in example 1 below.

Figure 2:
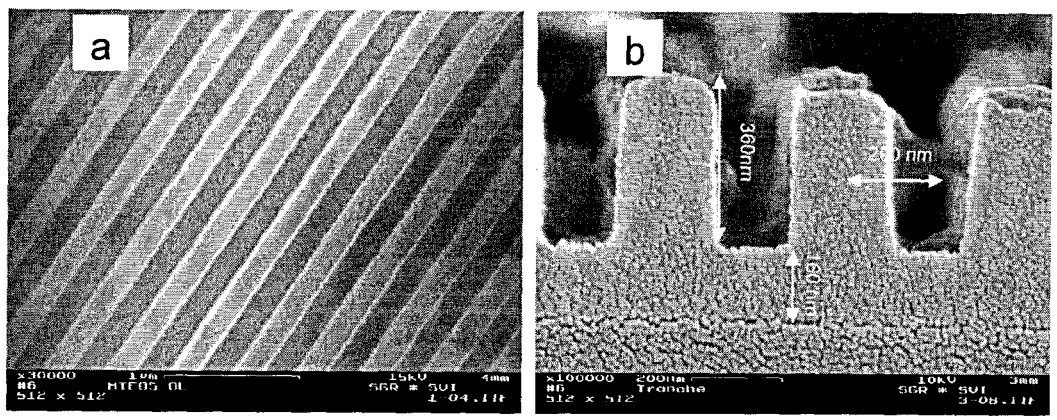

FIGS. 2a and b show scanning electron microscope images of the embossed sample obtained in example 1 below seen, relative to the embossed surface, from above (a) and in cross section (b).

EXAMPLE 1

Transfer of a Periodic Network of Micron-Size Hemispheres to a Silica Sol-Gel Layer A silica sol is prepared from a methyltriethoxysilane (sold by Sigma-Aldrich)/acetic acid (Prolabo) mixture having a 45/55 weight ratio. The solution is stirred at room temperature for 12 h.

A PDMS stamp is produced using a periodic network of hemispheres obtained by an interferential lithography process as a mold. The diameter of the hemispheres is 3 µm and their period is 5.5 µm. The molding is achieved by pouring a 10:1 mixture of the two (elastomer/catalyst) components of the Sylgard® 184 Silicone Elastomer Kit sold by Dow Corning onto the mold, by evacuating residual air bubbles under vacuum, then by cross-linking the elastomer at 80° C. for 4 h.

The sol is deposited by spin coating (2000 rpm, 1 min) on a 2 mm-thick 10×10 cm² substrate made of the glass sold by Saint-Gobain Glass under the registered trademark Planilux®, the surface of which was cleaned beforehand with Cerox® polishing powder. The layer is dried for 5 minutes at 50° C.

Following the deposition, the textured face of the PDMS stamp is brought into contact with the silica sol-gel layer. In order to remove air bubbles that could compromise the contact between the layer and the mask, the samples are placed in a sealing pouch and installed in a hermetic vessel that is evacuated until a pressure of 0.5 mbar is reached. After 20 minutes the pouch is heat sealed.

The samples are then placed in the autoclave in which they are simultaneously subjected to an increase in temperature to 110° C. and in pressure to 1.75 bar (5 min at 20° C., increase to 60° C. in 5 min, plateau at 60° C. for 10 min, increase to 110° C. in 5 min, plateau at 110° C. for 20 min and decrease to 35° C. in 15 min; increase from 0 to 1.75 bar in 5 min, plateau at 1.75 bar for 40 min, decrease to 0 bar in 15 min). After removal from the autoclave the samples are demolded cold.

The transfer of the pattern to the silica sol-gel layer is characterized by AFM. The hexagonal network of hemispheres is reproduced. The patterns obtained are similar to those borne by the stamp: 3 µm in width, 1.5 µm in height and a period of 5.5 µm.

EXAMPLE 2

Transfer of a Periodic Network of Micron-Size Hemispheres to a Polymethyl Methacrylate Layer A solution of 10% polymethyl methacrylate (PMMA) in methyl ethyl ketone (MEK) is prepared by mixing 20 g of PMMA powder of average molecular weight Mw=120000 (Sigma-Aldrich) with 180 g of MEK (Prolabo).

A PDMS stamp is produced using a periodic network of hemispheres obtained by an interferential lithography process as a mold. The diameter of the hemispheres is 3 µm and their period is 5.5 µm. The molding is achieved by pouring a 10:1 mixture of the two (elastomer/catalyst) components of the Sylgard® 184 Silicone Elastomer Kit sold by Dow Corning onto the mold, by evacuating residual air bubbles under vacuum, then by cross-linking the elastomer at 80° C. for 4 h.

The PMMA solution is deposited by spin coating (2000 rpm, 1 min) on a 2 mm-thick 10×10 cm² substrate made of the glass sold by Saint-Gobain Glass under the registered trademark Planilux®, the surface of which was cleaned beforehand with Cerox® polishing powder.

Following the deposition, the textured face of the PDMS stamp is brought into contact with the PMMA layer. In order to remove air bubbles that could compromise the contact between the layer and the mask, the samples are placed in a sealing pouch and installed in a hermetic vessel that is evacuated until a pressure of 0.5 mbar is reached. When the desired pressure is reached, the pouch is heat sealed.

The samples are then placed in the autoclave in which they are subjected to an increase in pressure and temperature (plateau at 20° C. for 5 min, increase to 168° C. in 10 min, plateau at 168° C. for 15 min and decrease to 40° C. in 30 min; increase from 0 to 1 bar in 5 min, plateau at 1 bar for 10 min, increase to 3 bar in 5 min, plateau at 3 bar for 30 min, decrease to 0 bar in 10 min).

The transfer of the pattern to the PMMA layer is characterized by AFM. The hexagonal network of hemispheres is reproduced. The patterns obtained are similar to those borne by the stamp: 3 µm in width, 1.5 µm in height and a period of 5.5 µm.

EXAMPLE 3

Transfer of a Periodic Network of Micron-Size Hemispheres to a Hybrid Polymethyl Methacrylate/SiO$_2$ Layer A solution of 10% polymethyl methacrylate (PMMA) in methyl ethyl ketone (MEK) is prepared by mixing 20 g of PMMA powder of average molecular weight Mw=120000 (Sigma-Aldrich) with 180 g of MEK (Prolabo). A suspension of silica nanoparticles (Nissan Chemical) in MEK is added to the PMMA solution in an amount of 20% by weight. The mixture is homogenized by magnetic stirring for 10 minutes.

A PDMS stamp is produced using a periodic network of hemispheres obtained by an interferential lithography process as a mold. The diameter of the hemispheres is 3 µm and their period is 5.5 µm. The molding is achieved by pouring a 10:1 mixture of the two (elastomer/catalyst) components of the Sylgard® 184 Silicone Elastomer Kit sold by Dow Corning onto the mold, by evacuating residual air bubbles under vacuum, then by cross-linking the elastomer at 80° C. for 4 h.

The solution of silica particles and PMMA is deposited by spin coating (2000 rpm, 1 min) on a 2 mm-thick 10×10 cm² substrate made of the glass sold by Saint-Gobain Glass under the registered trademark Planilux®, the surface of which was cleaned beforehand with Cerox® polishing powder.

Following the deposition, the textured face of the PDMS stamp is brought into contact with the hybrid PMMA/SiO$_2$ layer. In order to remove air bubbles that could compromise the contact between the layer and the mask, the samples are placed in a sealing pouch and installed in a hermetic vessel that is evacuated until a pressure of 0.5 mbar is reached. When the desired pressure is reached, the pouch is heat sealed.

The samples are then placed in the autoclave in which they are subjected to an increase in pressure and temperature (plateau at 20° C. for 5 min, increase to 168° C. in 10 min, plateau at 168° C. for 15 min, decrease to 40° C. in 30 min; increase from 0 to 1 bar in 5 min, plateau at 1 bar for 10 min, increase to 3 bar in 5 min, plateau at 3 bar for 30 min, and decrease to 0 bar in 10 min).

The transfer of the pattern to the PMMA layer is characterized by AFM. The hexagonal network of hemispheres is reproduced. The patterns obtained are similar to those borne by the stamp: 3 µm in width, 1.5 µm in height and a period of 5.5 µm.

EXAMPLE 4

Transfer of a Semi-Periodic Network of Nanoscale Pads to a Silica Sol-Gel Layer

A silica sol is prepared from a 50/50 by weight mixture of methyltriethoxy silane (sold by Sigma-Aldrich) and a hydrochloric acid solution pH=2. The solution is stirred at room temperature for 2 h.

A PDMS stamp is produced using an almost periodic network of pads obtained by an e-beam lithography process coupled with a "step and repeat" process as a mold. The pads have a length of 1.2 µm, a width of 200 nm or 400 nm and a height of 350 nm. The molding is achieved by pouring a 10:1 mixture of the two (elastomer/catalyst) components of the Sylgard® 184 Silicone Elastomer Kit sold by Dow Corning onto the mold, by evacuating residual air bubbles under vacuum, then by cross-linking the elastomer at 80° C. for 4 h.

The silica sol is deposited by spin coating (2000 rpm, 1 min) on a 2 mm-thick 10×10 cm² substrate made of the glass sold by Saint-Gobain Glass under the registered trademark Planilux®, the surface of which was cleaned beforehand with Cerox® polishing powder. The layer is dried for 5 minutes at 50° C.

Following the deposition, the textured face of the PDMS stamp is brought into contact with the silica sol-gel layer. In order to remove air bubbles that could compromise the contact between the layer and the mask, the samples are placed in a sealing pouch and installed in a hermetic vessel that is evacuated until a pressure of 0.5 mbar is reached. When the desired pressure is reached, the pouch is heat sealed.

The samples are then placed in the autoclave in which they are subjected to a cycle of increases in pressure and temperature (increase from 20 to 60° C. in 5 min, plateau at 60° C. for 5 min, increase to 130° C. in 5 min, plateau at 130° C. for 25 min, decrease to 40° C. in 20 min; increase from 0 to 2.5 bar in 5 min, plateau at 2.5 bar for 35 min, decrease to 0 bar in 20 min).

The transfer of the pattern to the silica sol-gel layer is characterized by AFM. The network of pads, characterized by a variable period, is reproduced. The patterns obtained are similar to those borne by the stamp. Pads of 200 nm and 400 nm in width are reproduced, they are 1.2 µm in length and 350 nm in height.

EXAMPLE 5

Transfer of a Semi-Periodic Network of Lines to a Silica Layer Using a PET Stamp A silica sol is prepared from a 50/50 by weight mixture of methyltriethoxy silane (sold by Sigma-Aldrich) and a hydrochloric acid solution pH=2. The solution is stirred at room temperature for 2 h.

The daughter stamps used are PET polymer films on which a coating has been deposited then textured by a roll-to-roll process. The polymer films have an approximately 10×10 cm$^2$ format (FIG. 1). The pattern of these films was defined with the aim of giving them "daylighting" properties (redirection of solar light toward the ceiling) while preserving the transparency of the PET. The pattern consists of a network of lines of 200 nm width for 350 nm of depth (aspect ratio=1.75) and a period of 400 nm. A certain amount of noise is introduced into the periodicity of the structure in order to limit diffraction effects (FIG. 1).

The surface of the PET film is thoroughly cleaned with alcohol and using adhesive rollers (sold by Teknek) to eliminate any trace of dust.

The silica sol is deposited by spin coating (2000 rpm, 1 min) on a 2 mm-thick 10×10 cm$^2$ substrate made of the glass sold by Saint-Gobain Glass under the registered trademark Planilux®, the surface of which was cleaned beforehand with Cerox® polishing powder. The layer is dried for 5 minutes at 50° C.

Following the deposition, the textured face of the PET stamp is brought into contact with the silica sol-gel layer. In order to remove air bubbles that could compromise the contact between the layer and the mask, the samples are placed in a sealing pouch and installed in a hermetic vessel that is evacuated until a pressure of 0.5 mbar is reached. When the desired pressure is reached, the pouch is heat sealed.

The samples are then placed in the autoclave in which they are subjected to a cycle of increases in pressure and temperature (increase from 20 to 60° C. in 5 min, plateau at 60° C. for 5 min, increase to 110° C. in 5 min, plateau at 110° C. for 25 min, decrease to 40° C. in 20 min; increase from 0 to 2 bar in 5 min, plateau at 2 bar for 35 min, decrease to 0 bar in 20 min).

The transfer of the pattern to the silica sol-gel layer is characterized by scanning electron microscope. The network of almost periodic lines is reproduced with a period of 400 nm. The patterns obtained are similar to those borne by the stamp: 200 nm wide and 400 nm high.

The invention claimed is:

1. A process for forming a texture on a substrate, the process comprising:
    depositing a deformable layer on the substrate, thereby obtaining a coated substrate, wherein the deformable layer comprises at least one member selected from the group consisting of a sol-gel material, nanoparticles and nanoparticles in a thermoplastic polymer matrix;
    bringing the deformable layer into contact with a textured face of a daughter stamp;
    introducing the coated substrate and the daughter stamp into a pouch that comprises an impermeable material;
    introducing the pouch and its contents into a hermetic vessel;
    evacuating air from the vessel until a pressure is at most equal to 0.5 bar;
    sealing the pouch, thereby obtaining a sealed pouch;
    reintroducing air into the vessel after sealing the pouch;
    introducing the sealed pouch and its contents into an autoclave;
    applying a pressure of between 0.5 and 8 bar and a temperature of between 25 and 400° C. for at least 15 minutes;
    opening the pouch; then
    separating the substrate and the daughter stamp.

2. The process of claim 1, wherein the process obtains a substrate suitable for extracting, guiding, or redirecting light.

3. The process of claim 1, wherein the process obtains a substrate suitable for microfluidics.

4. The process of claim 1, wherein the process obtains a superhydrophobic or superhydrophilic substrate.

5. The process of claim 1, wherein the substrate is a glass substrate.

6. The process of claim 1, wherein the substrate is a soda-lime-silica float glass.

7. The process of claim 1, wherein the deformable layer comprises a sol-gel material.

8. The process of claim 1, wherein the deformable layer comprises nanoparticles.

9. The process of claim 8, wherein the nanoparticles are TiO$_2$ nanoparticles.

10. The process of claim 8, wherein the nanoparticles are luminescent nanoparticles.

11. The process of claim 1, wherein the deformable layer comprises nanoparticles in a thermoplastic polymer matrix.

12. The process of claim 11, wherein the nanoparticles are TiO$_2$ nanoparticles.

13. The process of claim 11, wherein the nanoparticles are luminescent nanoparticles.

14. A process for forming a texture on a substrate, the process comprising:
    depositing a deformable layer on the substrate, thereby obtaining a coated substrate;
    bringing the deformable layer into contact with a textured face of a daughter stamp, wherein the textured face of the daughter stamp is air permeable;
    introducing the coated substrate and the daughter stamp into a pouch that comprises an impermeable material;
    introducing the pouch and its contents into a hermetic vessel;
    evacuating air from the vessel until a pressure is at most equal to 0.5 bar;
    sealing the pouch, thereby obtaining a sealed pouch;
    reintroducing air into the vessel after sealing the pouch;
    introducing the sealed pouch and its contents into an autoclave;
    applying a pressure of between 0.5 and 8 bar and a temperature of between 25 and 400° C. for at least 15 minutes;
    opening the pouch; then
    separating the substrate and the daughter stamp.

15. A process for forming a texture on a substrate, the process comprising:
    depositing a deformable layer on the substrate, thereby obtaining a coated substrate;
    bringing the deformable layer into contact with a textured face of a daughter stamp;
    introducing the coated substrate and the daughter stamp into a pouch that comprises an impermeable material;
    introducing the pouch and its contents into a hermetic vessel;
    evacuating air from the vessel until a pressure is at most equal to 0.5 bar;
    sealing the pouch, thereby obtaining a sealed pouch;
    reintroducing air into the vessel after sealing the pouch;
    introducing the sealed pouch and its contents into an autoclave;
    applying a pressure of between 0.5 and 8 bar and a temperature of between 25 and 400° C. for at least 15 minutes;
    opening the pouch; then
    separating the substrate and the daughter stamp,
    wherein
    the textured face of the daughter stamp comprises a polymer or hybrid organic (polymer)/inorganic material, and applying the temperature in the autoclave comprises raising the temperature in succession to a temperature above, then below the glass transition temperature of the polymer or hybrid organic (polymer)/inorganic material, or vice versa.

\* \* \* \* \*